United States Patent [19]
Nilssen

[11] Patent Number: 5,164,637
[45] Date of Patent: Nov. 17, 1992

[54] POWER SUPPLY FOR GAS DISCHARGE LAMPS

[76] Inventor: Ole K. Nilssen, 602 Caesar Dr., Barrington, Ill. 60010

[21] Appl. No.: 743,216

[22] Filed: Aug. 9, 1991

Related U.S. Application Data

[63] Continuation of Ser. No. 717,860, Jun. 19, 1991, which is a continuation of Ser. No. 636,246, Dec. 31, 1990, abandoned, which is a continuation of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation of Ser. No. 178,107, Aug. 14, 1980, abandoned, said Ser. No. 555,426, is a continuation-in-part of Ser. No. 330,599, Dec. 14, 1981, Pat. No. 4,441,083, which is a continuation of Ser. No. 973,741, Dec. 28, 1978, abandoned, which is a continuation-in-part of Ser. No. 890,586, Mar. 20, 1978, Pat. No. 4,184,128, said Ser. No. 178,107, is a continuation-in-part of Ser. No. 23,849, Mar. 26, 1979, Pat. No. 4,279,011.

[51] Int. Cl.[5] .......................................... H05B 41/29
[52] U.S. Cl. ............................ 315/209 R; 315/226; 363/37
[58] Field of Search .................. 315/209 R, 224, 226, 315/291, 297, DIG. 5, DIG. 7; 363/37

[56] References Cited

U.S. PATENT DOCUMENTS 3,657,598 4/1972 Nomura et al. ................ 315/226 X
3,896,336 7/1975 Schreiner et al. .................. 315/226

*Primary Examiner*—David Mis

[57] ABSTRACT

High-efficiency inverter circuits, particularly half-bridge devices, are especially suitable for energizing gas discharge lamps. The inverters preferably employ a series-connected combination of an inductor and a capacitor to be energized upon periodic transistor conduction. Transistor drive current is provided through the use of at least one saturable inductor to control the transistor inversion frequency to be equal to or higher than the natural resonant frequency of the inductor and capacitor combination. The inverters can develop high output voltages to supply external loads connected to the inductor-capacitor combination.

7 Claims, 2 Drawing Sheets

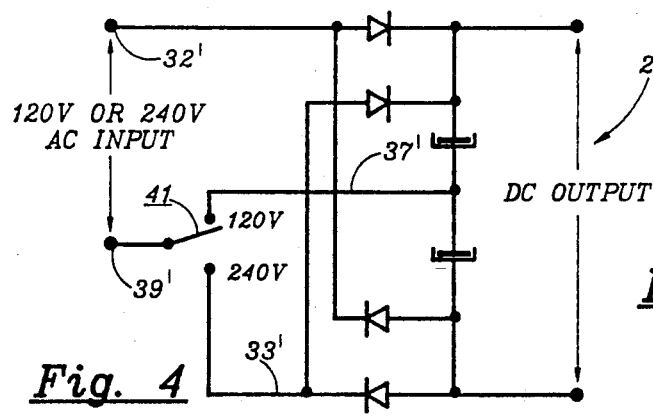
Fig. 4
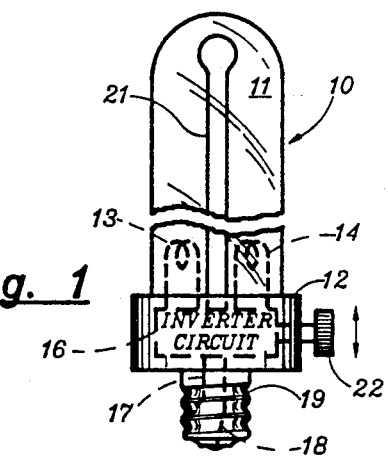
Fig. 1
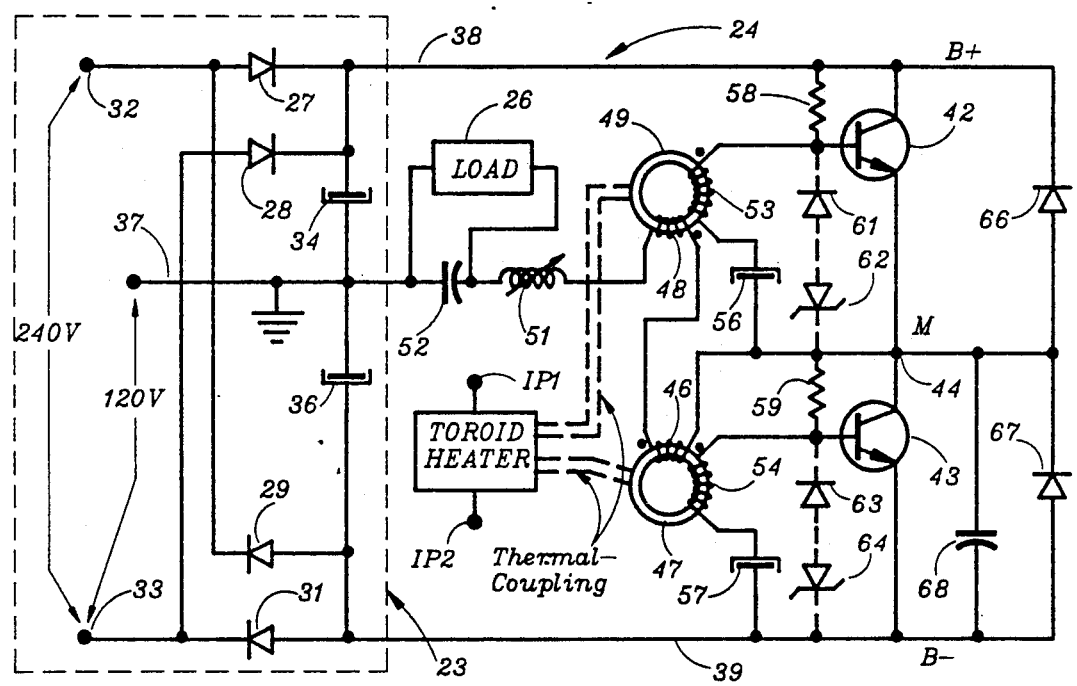
Fig. 2
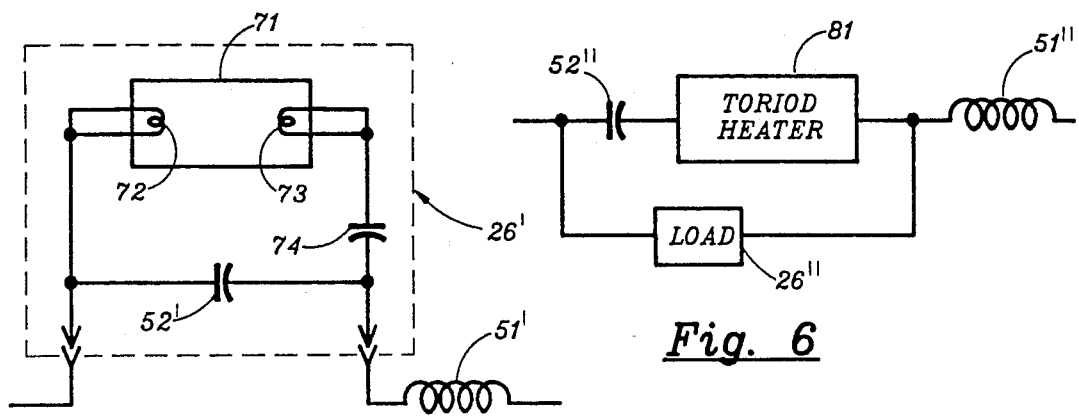
Fig. 5
Fig. 6

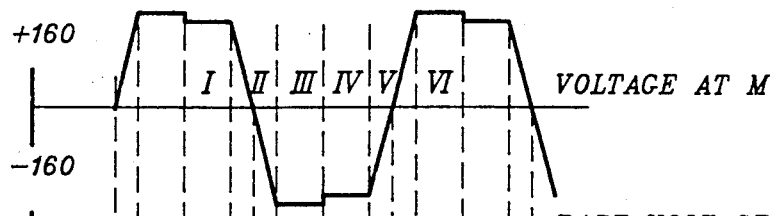
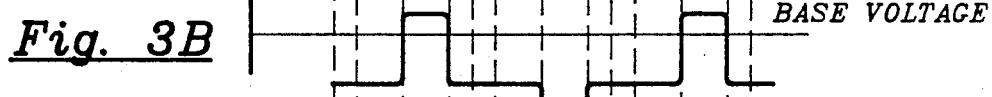
Fig. 3A — VOLTAGE AT M
Fig. 3B — BASE VOLTAGE
Fig. 3C — TRANSISTOR CURRENT
Fig. 3D — CURRENT THROUGH L / VOLTAGE ACROSS C
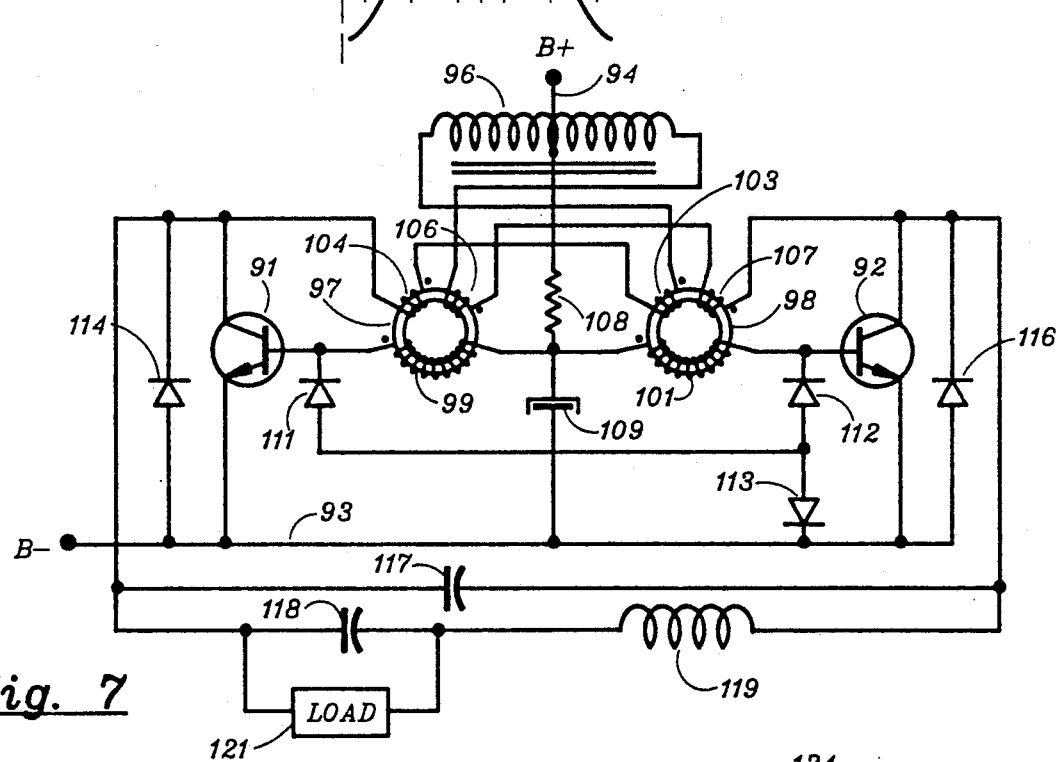
Fig. 7
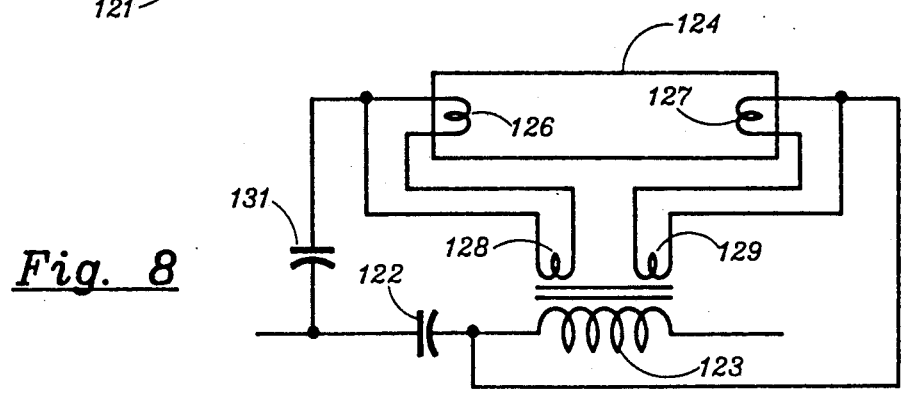
Fig. 8

POWER SUPPLY FOR GAS DISCHARGE LAMPS

RELATED APPLICATIONS

The present application is a continuation of Ser. No. 07/717,860 filed Jun. 19, 1991; which is a continuation of Ser. No. 07/636,246 filed Dec. 31, 1990, now abandoned; which was a continuation of Ser. No. 06/787,692 filed Oct. 15, 1985, now abandoned; which was a continuation of Ser. No. 06/644,155 filed Aug. 27, 1984, now abandoned; which was a continuation of Ser. No. 06/555,426 filed Nov. 23, 1983, now abandoned; which was a continuation of Ser. No. 06/178,107 filed Aug. 14, 1980, now abandoned.

Application Ser. No. 06/555,426 filed Nov. 23, 1983 was also a continuation in part of Ser. No. 06/330,599 filed Dec. 14, 1981, now U.S. Pat. No. 4,441,087; which was a continuation of Ser. No. 973,741 filed Dec. 28, 1978, now abandoned; which was a continuation in part of Ser. No. 890,586 filed Mar. 20, 1978, now U.S. Pat. No. 4,184,128.

Application Ser. No. 06/178,107 filed Aug. 14, 1980 was also a continuation in part of Ser. No. 23,849 filed Mar. 26, 1979, now U.S. Pat. No. 4,279,011.

BACKGROUND OF THE INVENTION

1. Field of Invention

This invention relates in general to power supply circuits, and, more particularly, to high-efficiency inverter circuits operable to provide high voltage outputs suitable for powering gas discharge lamps.

2. Description of the Prior Art

As is well known in the art, the main function of an inverter circuit is to convert a direct or DC input voltage into an alternating or AC voltage output. See, for example my U.S. Pat. No. 4,184,128, issued Jan. 15, 1980, and entitled "High Efficiency Push-Pull Inverters"; Myrrey et al. U.S. Pat. No. 3,467,852, issued Sep. 16, 1969, entitled "High Speed Controlled Switching Circuit"; Engel et al. U.S. Pat. No. 3,753,071, issued Aug. 14, 1973, for "Low Cost Transistorized Inverter"; and Suzuki et al. U.S. Pat. No. 4,031,454, issued Jun. 21, 1977, entitled "Transistor Inverter".

In certain applications of inverter circuits, such as energizing fluorescent or other gas discharge lamps, it is important to provide high voltage both for starting ease and efficienct operation. The following U.S. patents are believed to be representative of the prior art relevant to such lamps and energizing circuits therefor:

| Patentee | Patent No. | Issue Date | Title |
| --- | --- | --- | --- |
| Morley | 2,279,635 | 04/14/42 | Luminous Vapor Lamp |
| Miller | 2,298,961 | 10/13/42 | Fluorescent Lamp |
| Polevitzky | 2,405,518 | 08/06/46 | Illuminating Device |
| Rogers | 2,505,993 | 05/02/50 | Fluorescent Electric Lamp |
| Dupuy | 2,525,022 | 10/10/50 | Circular Lighting Fixture |
| Baumgartner et al. | 2,817,004 | 12/17/57 | Adapter Holder for Circular Lamps |
| Fry | 2,878,372 | 03/17/59 | Circular Lighting Fixture |
| Reaves | 3,059,137 | 10/16/62 | Screw-in Fluorescent Lighting Fixture |
| Grunwaldt | 3,084,283 | 04/02/63 | Transistor-Battery Supply for Gas Discharge Tubes |
| Wenrich et al. | 3,155,875 | 11/03/64 | High Frequency Ballast for Fluorescent Lamps |
| Genuit | 3,263,122 | 07/26/66 | Current Limiting |
| Johnson | 3,634,681 | 01/11/72 | Inverter Crcts and Apparatus for Operating Electric Discharge Lamps & Other Loads Integral Ballast, Lamp-Holder Support and Wireway |
| Piccola | 3,704,212 | 11/28/72 | Adjustable Light Fixture for U-Shaped Lamps |
| Anderson | 4,093,893 | 06/06/78 | ShortArc Fluorescent Lamp |
| Wheeler | 4,093,974 | 06/06/79 | Fluorescent Lampholder Ass'y for Circline Lamp |
| Young et al. | 4,173,730 | 11/06/79 | Compact Fluorescent Lamp Unit having Integral Crct Means for DC Operation |

While gas discharge lamp units and associated energizing circuits are generally known in the prior art typified by these patents, need has arisen for improved devices of these types, particularly inexpensive, reliable and highly efficient inverter circuits which can be employed to provide high voltage outputs suitable for energizing gas discharge lamps.

SUMMARY OF THE INVENTION

The present invention is directed to satisfy these needs. The inverter circuits according to the present invention are highly efficient, can be compactly constructed and are ideally suited for energizing gas discharge lamps, particularly "instant-start" and "self-ballasted" fluorescent lamps.

In general, according to one form of the present invention, a series-connected combination of an inductor and a capacitor is provided in circuit with the inverter transistors to be energized upon periodic transistor conduction. Transistor drive current is preferably provided through the use of at least one saturable inductor to control the transistor inversion frequency to be equal to or greater than the natural resonant frequency of the inductor and capacitor combination. The high voltages efficiently developed by loading the inverter with the inductor and capacitor are ideally suited for energizing external loads such as gas discharge lamps. In such an application, the use of an adjustable inductor permits control of the inverter output as a means of adjusting the level of lamp illumination.

According to another important form of the present invention, reliable and highly efficient half-bridge inverters include a saturable inductor in a current feedback circuit to drive the transistors for alternate conduction. The inverters also include a load having an inductance sufficient to effect periodic energy storage for self-sustained transistor inversion. As a result, these half-bridge inverter circuits obviate the need for additional voltage feedback as required in the prior art such as disclosed in the previously-mentioned Suzuki patent. Importantly, improved reliability is achieved because of the relatively low and transient-free voltages across the transistors in these half-bridge inverters.

Further, according to another feature of the present invention, novel and economical power supplies particularly useful with the disclosed inverter circuits convert conventional AC input voltages to DC for supply to the inverters.

These and other important objects of the present invention will become apparent from the following description which, when taken in conjunction with the accompanying drawings, discloses preferred embodiments of the invention.

BRIEF DESCRIPTION OF THE DRAWINGS

FIG. 1 is a front elevation of a folded fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIGS. 3A, 3B, 3C, 3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter output;

FIG. 7 is an alternate form of push-pull inverter circuit accordind to the present invention; and FIG. 8 is a schematic diagram showing the connection of a gas discharge lamp of the "rapid-start" type to an inductor-capacitor-loaded inverter according to the present invention.

DESCRIPTION OF THE PREFERRED EMBODIMENTS

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12. The inverter circuit 16, which can be in the form schematically illustrated in FIGS. 2 or 7, will be described in detail later.

The inverter circuit 16 is connected by leads 17, 18 to a screw-type plug 19 adapted for screw-in insertion into a standard Edison-type incandescent lamp socket at which a typical 60 Hz. 120 volt AC source is available. A ground plane comprising a wire or metallic strip 21 is disposed adjacent a portion of the fluorescent lamp 11 as a starting aid. Finally, a manually-rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device such as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B− line 39, respectively. The power supply 23 also comprises a voltage doubler and rectifier optionally connectable to a 120 volt AC input taken between the ground line 37 and terminal 33 or 32.

The voltage doubler and rectifier means provides a direct electrical connection by way of line 37 between one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and −160 volts on the B− line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B− lines 38 and 39, respectively. The collector of trasistor 42 is connected to the B+ line 38, the emitter of transistor 42 and the collector of transistor 43 are connected to a midpoint line 44 (designated "M") and the emitter of transistor 43 is connected to the B− line 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B− lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 64 in turn connected to the midpoint line 44; similarly, a diode 63 and a series Zener diode 64 in turn connected to the B− line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 38 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become nonconductive. As shown in FIG. 3c, current-flow in transistor 43 terminates at the end of period I.

Because the current through inductor 51 cannot change instantaneously, current will flow from the B− bus 39 through capacitor 68, causing the voltage at midpoint line 44 to drop to −160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B− bus through the shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, the saturable inductors 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equel to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47, 49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low, the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impdance means and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B− line 93. A B+ lead 94 is connected to the center-tap of a transformer 96. In order to provide drive current to the transistors 91, 92 for control of their conduction frequency, saturable inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal is connected to terminal 102 through a bias resistor 108. A bias capacitor 109 connects terminal 102 to the B− lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B− lead 93. The common Zener diode 113 serves the same function as individual Zener diodes 62, 64 in FIG. 2.

Shunt diodes 114, 116 are connected across the collector-emitter terminals of transistors 91, 92, respectively. A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplication). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

It is thought that the present invention and many of its attendant advantages will be understood from the foregoing description and that many changes may be made in the form and construction of its components parts, the forms described being merely preferred embodiments of the invention.

I claim:

1. An electronic ballast comprising:
   a source operative to provide a DC voltage at a pair DC terminals; and
   inverter means connected with the DC terminals and operative to provide an inverter voltage at a pair of inverter terminals; the inverter means including connect means operative to allow connection of a gas discharge lamp with the inverter terminals; the inverter means also including a transistor having a pair of control terminals to which is provided a control signal; the transistor being controlled by the control signal in that: (i) to render the transistor substantially conductive, the magnitude of the control signal must be higher than a certain level; and (ii) to render the transistor substantially non-conductive, the magnitude of the control signal must be lower than said certain level;
   the control signal being characterized by:
   (a) alternating at a fundamental frequency
   (b) having a fundamental period;
   (c) during each fundamental period, having an instantaneous magnitude which is: (i) higher than said certain level for a total first duration, and (ii) lower than said certain level for a total second duration; the total second duration being substantially longer than the total first duration; and (d) having a peak-to-peak magnitude substantially larger than twice the forward voltage drop of the base-emitter junction in a transistor having an emitter, a collector and a base.

2. An electronic ballast comprising:

a source operative to provide a DC voltage at a pair of DC terminals; and an inverter connected with the DC terminals and operative to provide an inverter output voltage at a pair of inverter output terminals; the inverter output voltage having a fundamental cycle period; during each fundamental cycle period the magnitude of the inverter output voltage (i) increases in a substantially monotonic manner during all of a first period, (ii) remains at a substantially constant positive level during all of a second period, (iii) decreases in a substantially monotonic manner during all of a third period, and (iv) remains at a substantially constant negative level during all of a fourth period; the sum of the first, second, third and fourth periods being equal to the total duration of the fundamental cycle period; the duration of the second period being substantially equal to that of the fourth period; the duration of the second period being substantially shorter than half the total duration of the fundamental cycle period; the inverter being characterized by including at least two transistors, with each transistor conducting current during at least a part of each fundamental cycle period, but never at the same time and never during said first and third periods.

3. The electronic ballast of claim 2 wherein the duration of the first period is longer than one twentieth of the duration of the second period.

4. An electronic ballast comprising:

a source operative to provide a DC voltage at a pair of DC terminals; and an inverter connected with the DC terminals and operative to provide an inverter output voltage at a pair of inverter output terminals; the inverter output voltage having a fundamental cycle period characterized by consisting of four periods: (i) a first period, all during which the magnitude of the inverter output voltage increases in a substantially monotonic manner, (ii) a second period, all during which the magnitude of the inverter output voltage remains at a substantially constant positive level, (iii) a third period, all during which the magnitude of the inverter output voltage decreases in a substantially monotonic manner, and (iv) a fourth period, all during which the magnitude of the inverter output voltage remains at a substantially constant negative level; the sum of the first, second, third and fourth periods being equal to the total duration of the fundamental cycle period; the duration of the second period being substantially equal to that of the fourth period; the duration of the second period being substantially shorter than half the total duration of the fundamental cycle period; the inverter being characterized by including two alternatingly conducting transistors; each transistor conducting current during a part of each fundamental cycle period, but never during said first and third periods.

5. The electronic ballast of claim 4 wherein: (i) the source includes a rectifier and filter circuit connected with the AC power line voltage of an ordinary electronic utility power line; and (ii) the absolute magnitude of the DC voltage is larger than the peak absolute magnitude of the AC power line voltage.

6. An electronic ballast comprising:

rectifier and filter circuit connected with the AC power line voltage of an ordinary electric utility power line and operative to provide a DC voltage at a pair of DC terminals; and inverter connected with the DC terminals and operative to provide an inverter voltage at a pair of inverter terminals;

the inverter voltage being characterized by:

(a) alternating at a fundamental frequency;

(b) having a fundamental cycle period; each fundamental cycle period including a first and a second half-cycle; the complete fundamental cycle period being defined as having 360 degrees;

(c) during its first half-cycle, existing for a first duration at a first substantially constant voltage level;

(d) during its second half-cycle, existing for a second duration at a second substantially constant voltage level;

(e) the first duration being substantially equal to the second duration;

(f) the first duration being equal to or longer than 45 degrees; and (g) the second duration being equal to or shorter than 150 degrees;

the inverter being characterized by including a first and a second transistor; the first transistor conducting current, but only during the first duration; the second transistor conducting current, but only during the second duration; such that neither transistor conducts current while the inverter voltage transitions between the two substantially constant voltage levels.

7. The ballast of claim 6 wherein the absolute magnitude of the DC voltage is larger than the peak absolute magnitude of the AC power line voltage.

* * * * *